(12) United States Patent
Matsumoto

(10) Patent No.: US 7,576,328 B2
(45) Date of Patent: Aug. 18, 2009

(54) RADIATION IMAGE DETECTOR

(75) Inventor: Kenji Matsumoto, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 46 days.

(21) Appl. No.: 12/015,001

(22) Filed: Jan. 16, 2008

(65) Prior Publication Data

US 2008/0173826 A1     Jul. 24, 2008

(30) Foreign Application Priority Data

Jan. 19, 2007    (JP)  ............................... 2007-009840

(51) Int. Cl.
    *H01L 27/146*      (2006.01)
(52) U.S. Cl. .................................... 250/370.09; 378/35
(58) Field of Classification Search ....................... None
See application file for complete search history.

(56) References Cited

U.S. PATENT DOCUMENTS

| | | | |
|---|---|---|---|
| 6,919,568 B2 * | 7/2005 | Odogba et al. | 250/370.09 |
| 7,049,601 B2 * | 5/2006 | Agano | 250/370.09 |
| 7,126,127 B2 | 10/2006 | Watanabe et al. | |
| 2006/0255239 A1 | 11/2006 | Watanabe et al. | |

FOREIGN PATENT DOCUMENTS

JP      2005-183670 A      7/2005

\* cited by examiner

*Primary Examiner*—David P Porta
*Assistant Examiner*—Yara B Green
(74) *Attorney, Agent, or Firm*—Sughrue Mion, PLLC

(57) ABSTRACT

Enlargement of faulty pixel portions caused by irradiation of radiation is prevented in a radiation image detector equipped with a charge generating layer for generating charges when the radiation is irradiated thereon. Radiation irradiation suppressing members, for suppressing the irradiation of radiation, are provided at faulty pixel portions, which are detected in advance.

16 Claims, 4 Drawing Sheets

PLAN VIEW

RADIATION

FOREIGN PARTICLE
SECTIONAL VIEW

FOREIGN PARTICLE
SECTIONAL VIEW

FOREIGN PARTICLE
SECTIONAL VIEW

FOREIGN PARTICLE
SECTIONAL VIEW

FOREIGN PARTICLE
SECTIONAL VIEW

FOREIGN PARTICLE
SECTIONAL VIEW

RADIATION IMAGE DETECTOR

BACKGROUND OF THE INVENTION

1. Field of the Invention

The present invention is related to a radiation image detector that records radiation images when radiation is irradiated thereon.

2. Description of the Related Art

Various radiation image detectors, that record radiation images of subjects when radiation which has passed through the subjects is irradiated thereon, have been proposed and are currently in use.

A radiation image detector that utilizes semiconductor materials that generate charges is a type of the aforementioned radiation image detectors. Radiation image detectors of this type that employ an optical readout method and that employ a TFT readout method have been proposed (refer to Japanese Unexamined Patent Publication No. 2005-183670, U.S. Pat. No. 7,126,127 and U.S. Patent Application Publication No. 20060255239).

Radiation image detectors that employ a-Se as the semiconductor material have been proposed.

Faulty pixels is a problem that often occurs in radiation image detectors that employ a-Se. A factor that causes faulty pixels is crystallized selenium, which is interspersed within the a-Se semiconductor material. Accidental charge injection, having the crystallized selenium as its origin, causes excessively accumulation or excessive flow of charges within the radiation image detector, which in turn causes faulty pixels to be generated.

It has been discovered that the size of the crystallized selenium increases as irradiation of radiation onto the radiation image detectors and readout of image signals therefrom are repeated.

That is, the crystallized selenium that originates from a foreign particle or the like becomes larger as recording and readout of radiation images are repeated. This causes a problem that the enlargement of the crystallized selenium increases the occurrence of faulty pixels.

SUMMARY OF THE INVENTION

The present invention has been developed in view of the foregoing circumstances. It is an object of the present invention to provide a radiation image detector which is capable of suppressing increases in faulty pixels that accompany increases in the size of crystallized selenium.

A radiation image detector of the present invention comprises:

a charge generating layer, for generating charges when recording electromagnetic waves bearing a radiation image is irradiated thereon; and electromagnetic wave irradiation suppressing members, for suppressing irradiation of the recording electromagnetic waves, provided above faulty pixel portions, which are detected in advance.

The charge generating layer of the radiation image detector may have a-Se as its main component.

The electromagnetic wave irradiation suppressing member may include a material that absorbs at least 50% of the recording electromagnetic waves irradiated thereon.

The electromagnetic wave irradiation suppressing member may be embedded within a material that transmits the recording electromagnetic waves.

The electromagnetic wave irradiation suppressing member may be formed by mixing a material that absorbs the recording electromagnetic waves into one of a resin that transmits the recording electromagnetic waves and an adhesive.

The electromagnetic wave irradiation suppressing member may be provided on a member that transmits the recording electromagnetic waves and which is arranged at a predetermined interval from the charge generating layer.

Here, "faulty pixel" refers to regions within images where, when image signals are read out from radiation image detectors and displayed, white dots, black dots, lines, or other various shapes appear, where normally they must not be present.

The term "above" refers to an upstream side, from which the recording electromagnetic waves are irradiated. That is, the positions at which the electromagnetic wave irradiation suppressing members are provided need only to be upstream of the charge generating layer, and are not limited to directly above the charge generating layer. For example, in the case that the radiation image detector is of the so called indirect conversion type, the electromagnetic wave irradiation suppressing members may be provided on a wavelength converting layer that converts radiation to light.

The radiation image detector of the present invention comprises: the charge generating layer, for generating charges when recording electromagnetic waves bearing a radiation image is irradiated thereon; and the electromagnetic wave irradiation suppressing members, for suppressing irradiation of the recording electromagnetic waves, provided above faulty pixel portions, which are detected in advance. Therefore, enlargement of faulty pixels due to the irradiation of the recording electromagnetic waves can be suppressed.

BEST MODE FOR CARRYING OUT THE INVENTION

Figure 1:
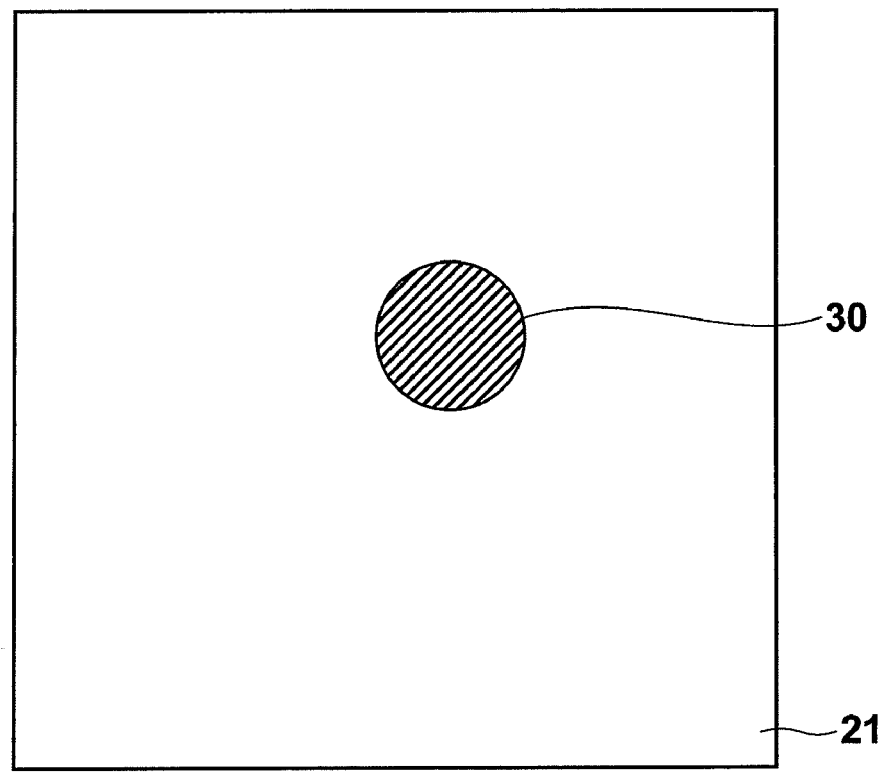
FIG. 1 is a plan view and a sectional view of a radiation image detector according to a first embodiment of the present invention.
Figure 1:
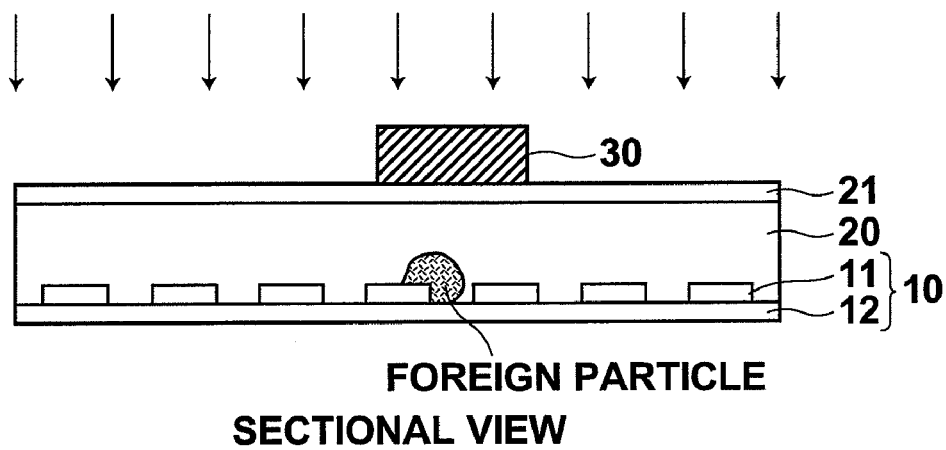

Hereinafter, a radiation image detector according to embodiments of the present invention will be described with reference to the attached drawings. FIG. 1 is a plan view and a sectional view that illustrates the schematic structure of the radiation image detector according to a first embodiment of the present invention.

The radiation image detector according to the first embodiment is a radiation image detector that employs the so called TFT readout method, and is constituted by: an active matrix substrate 10; a semiconductor film 20; and an upper electrode 21, which are stacked in this order.

The semiconductor film 20 has electromagnetic wave conductivity, and generates charges therein when X rays are irradiated thereon. A 100 μm to 1000 μm thick non crystalline a-Se film having selenium as its main component may be employed as the semiconductor film 20.

The upper electrode 21 is constituted by a low resistance conductive material, such as Au and Al.

The active matrix substrate 10 is constituted by a great number of pixel portions 11, which are arranged two dimensionally on a glass substrate 12. Each pixel portion 11 is constituted by: a collecting electrode, for collecting charges which are generated within the semiconductor film 20; a storage capacitor, for storing the charges which are collected by the collecting electrode; and a TFT switch, for reading out the charges which are stored in the storage capacitor. A great number of scanning wires, for turning the TFT switches ON and OFF, and a great number of data lines, through which the charges stored in the storage capacitors are read out, are also provided in the active matrix substrate 10.

The radiation image detector of the first embodiment is also provided with a radiation irradiation suppressing member 30, for suppressing irradiation of radiation onto the upper electrode 21, as illustrated in FIG. 1.

The radiation irradiation suppressing member 30 is formed by a material that absorbs at least 50% of radiation irradiated thereon, such as lead, silver, and bismuth.

Note that other metals, such as Ba, Pb, Ti, Zn, Sr, Zr, Mn, Ni, Co, Nb, Ta, Bi, Fe, Cu, In, Sn, and Sb, as well as compounds thereof may also be utilized as the material for the radiation irradiation suppressing member 30. As further alternatives, precious metals, such as Ag, Au, and Pt, as well as rare earth compounds, such as Y, La, Gd, and Lu, may also be utilized as the material for the radiation irradiation suppressing member 30.

It is preferable for the radiation irradiation suppressing member 30 to be formed by a metal having an atomic number of 22 (Ti) or greater and a density of 4.0 g/cm$^3$ or greater, or fine particles of a metal compound, contained in a binder. A metal having an atomic number of 38 (Sr) or greater is further preferred. A metal having a density of 8.0 g/cm$^3$ is also further preferred. Examples of such metals are fine particles of chemically stable W, Ot, Au, Ag, Mo, and Pb, or oxides of heavy metals.

The radiation irradiation suppressing member 30 is provided above a faulty pixel portion (a location where a foreign particle is present) of the main body of the radiation image detector.

Here, methods by which the faulty pixel portion of the main body of the radiation image detector is detected will be described.

Visual inspection of the main body of the radiation image detector is a method for detecting the faulty pixel portion. In this method, the main body of the radiation image detector is observed from the side of the glass substrate 12. A location having a physical fault, such as a location at which a foreign particle is present, is designated as the faulty pixel portion.

Alternatively, the main body of the radiation image detector may be observed from the side of the upper electrode 21. A location at which a protrusion is present may be designated as the faulty pixel portion.

Actually performing repeated irradiation of radiation onto the radiation image detector and readout of radiation images therefrom, and designating a location at which the enlargement rate is greater than or equal to a predetermined ratio as the faulty pixel portion is another method for detecting the faulty pixel portion. For example, irradiation of radiation and readout of radiation images may be repeated 1000 to 10000 times. Then, a portion of the image which becomes enlarged may be found. If the enlargement rate is greater than or equal to a predetermined ratio, the portion of the image may be designated as the faulty pixel portion.

The size of the radiation irradiation suppressing member 30 may correspond to approximately nine pixels (3×3 pixels) in the case that size of the faulty pixel portion is approximately 1 pixel to 4 pixels (2×2 pixels), for example. That is, if the radiation image detector is a device in which each pixel is 100 μm×100 μm, a 0.3 mm×0.3 mm×0.3 mm lead cube may be utilized as the radiation irradiation suppressing member 30.

Here, the method by which the radiation irradiation suppressing member 30 is positioned and fixed onto the main body of the radiation image detector will be described.

First, the main body of the radiation image detector is fixed on a precision microdrive stage. Next, a jig, which is capable of grasping and releasing the radiation irradiation suppressing member 30 is prepared, and the radiation irradiation suppressing member 30 is held by the jig.

Adhesive is coated on the upper electrode 21 of the main body of the radiation image detector, the radiation irradiation suppressing member 30, or both.

The position of the faulty pixel portion, which has been detected in advance by one of the aforementioned methods, and the position of the radiation irradiation suppressing member 30 are caused to match, by controlling the precision microdrive stage.

Finally, the jig is moved in a direction that approaches the main body of the radiation image detector, the radiation irradiation suppressing member 30 is caused to contact the main body of the radiation image detector, and adhesive fixation is achieved.

In the case that each pixel portion 11 of the radiation image detector is small, on the order of 50 μm×50 μm, for example, and the faulty pixel portion is also a small 2×2 pixel region, the size of the radiation irradiation suppressing member will be 0.1 mm×0.1 mm'0.1 mm. In this case, it becomes difficult for the aforementioned jig to handle the radiation irradiation suppressing member 30.

Figure 2:
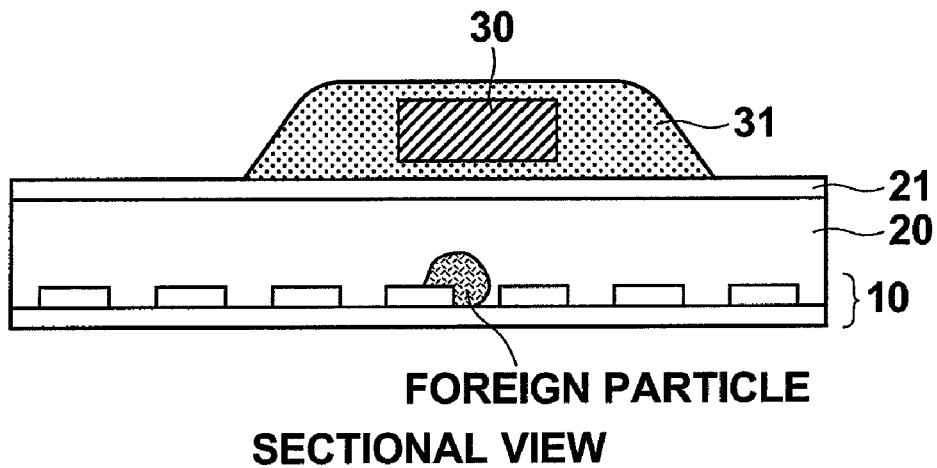
FIG. 2 is a diagram that illustrates the schematic structure of a radiation image detector according to an alternate embodiment of the present invention.

Therefore, a 0.1 mm×0.1 mm×0.1 mm cube of lead (the radiation irradiation suppressing member 30) may be embedded in a material 31 that transmits radiation, as illustrated in FIG. 2. The material 31 can be handles by the jig, to provide the radiation irradiation suppressing member 30 on the main body of the radiation image detector.

Figure 3:
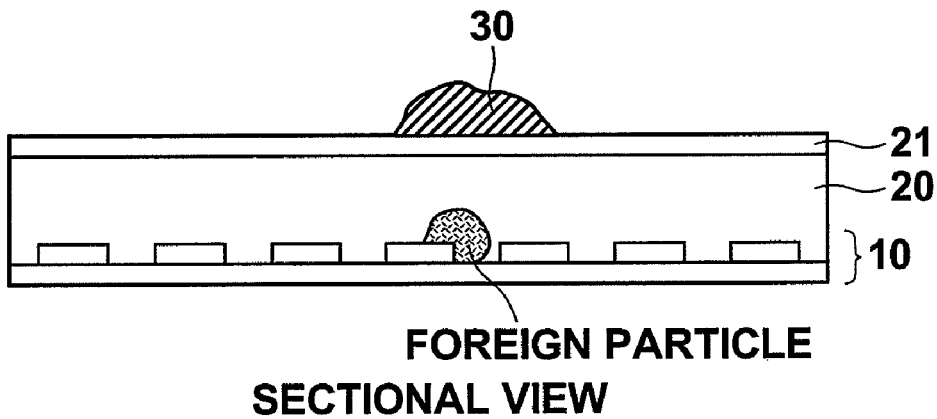
FIG. 3 is a diagram that illustrates the schematic structure of a radiation image detector according to another alternate embodiment of the present invention.

Alternatively, fine particles of lead or silver may be mixed into an epoxy adhesive that transmits radiation and utilized as the radiation irradiation suppressing member 30. Then, the epoxy may be coated above the faulty pixel portion, as illustrated in FIG. 3. Specifically, metallic powder, such as lead powder, may be mixed into a material such as an epoxy adhesive, and the epoxy adhesive may be placed within an adhesive dispenser. Thereafter, the position of the faulty pixel portion and the position of the adhesive dispenser may be matched, and the adhesive is dispensed by the dispenser to form a mound on the upper electrode 21. Note that a mound of resin, in which metallic powder is mixed, may be formed on the upper surface of the main body of the radiation image detector, then an adhesive formed of a material that transmits radiation may be coated thereon, to bind the resin.

Figure 4:
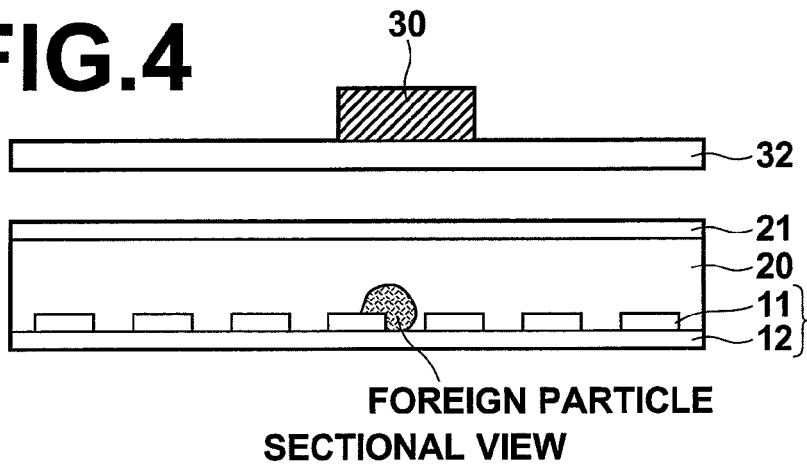
FIG. 4 is a diagram that illustrates the schematic structure of a radiation image detector according to still another alternate embodiment of the present invention.

There may be cases in which the upper electrode 21 is prone to peeling off of the main body of the radiation image detector, and it is difficult to fix the radiation irradiation suppressing member 30 directly on the upper electrode 21. In these cases, a plate 32 formed by a material that transmits radiation may be provided at a predetermined interval from the main body of the radiation image detector, as illustrated in FIG. 4. Then, the radiation irradiation suppressing member 30 may be provided on the plate 32.

Figure 5:
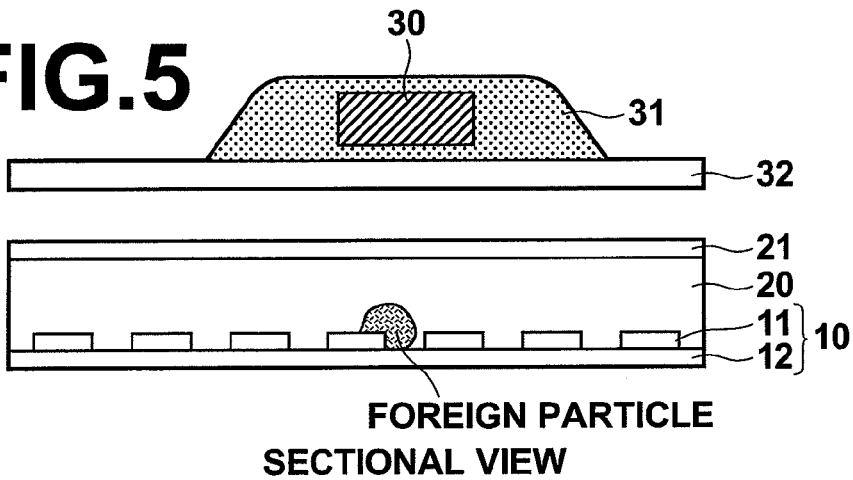
FIG. 5 is a diagram that illustrates the schematic structure of a radiation image detector according to still yet another alternate embodiment of the present invention.
Figure 6:
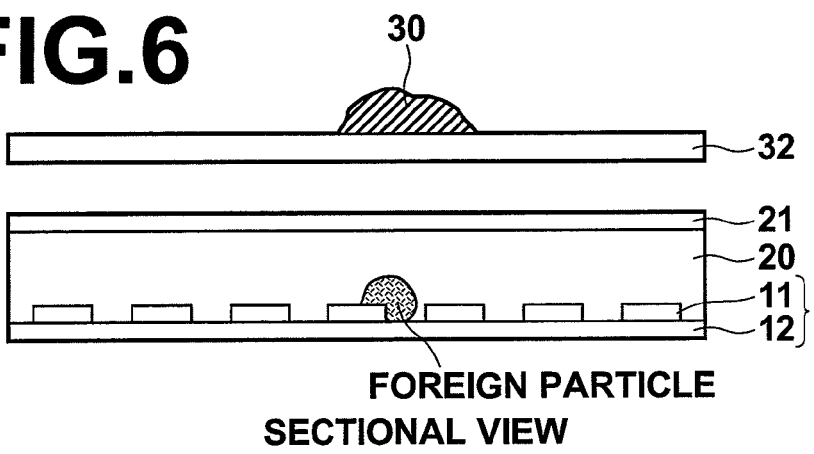
FIG. 6 is a diagram that illustrates the schematic structure of a radiation image detector according to another alternate embodiment of the present invention.

Alternatively, the material 31 that transmits radiation, in which the radiation irradiation suppressing member 30 is embedded, may be provided on the plate 32, as illustrated in FIG. 5. As a further alternative, an epoxy adhesive, in which fine particles of lead or silver are mixed, maybe coated on the plate 32, as illustrated in FIG. 6.

Figure 7:
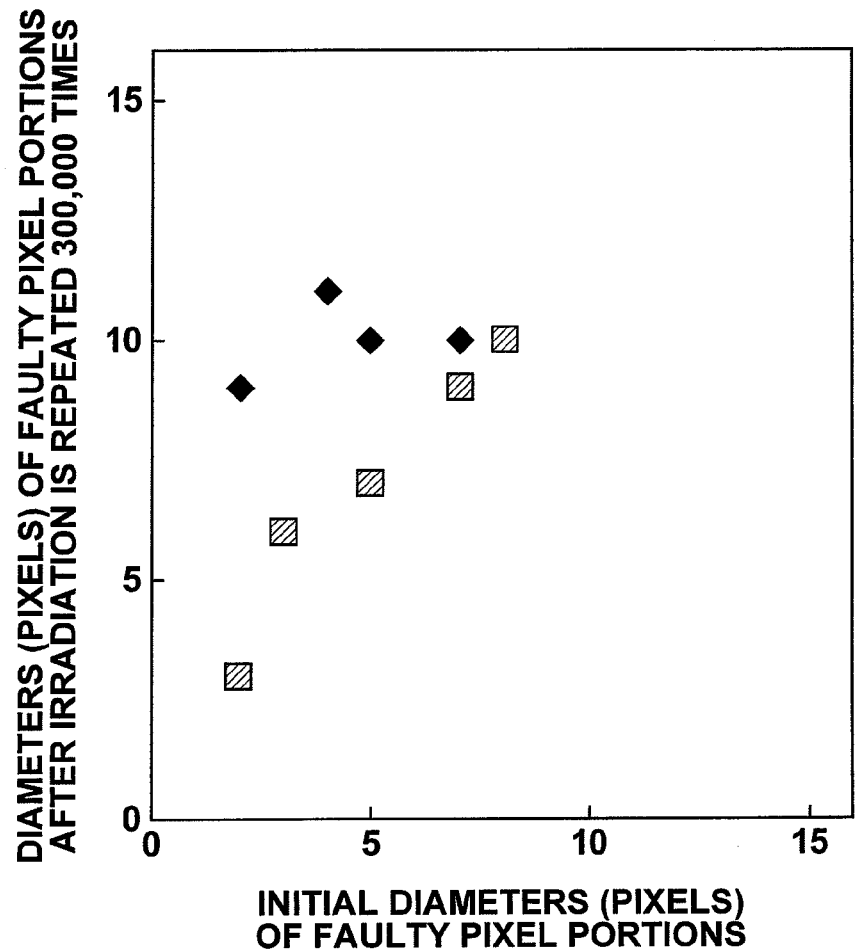
FIG. 7 is a graph for explaining the effects of the radiation image detector of the present invention.

Here, the advantageous effects obtained when the radiation irradiation suppressing member 30 is provided will be described. FIG. 7 is a graph that illustrates the effects of the present invention. In the graph of FIG. 7, the horizontal axis represents the initial diameters of faulty pixel portions, and the vertical axis represents the diameters of the faulty pixel portions after irradiation of radiation and readout of image signals are repeated 300000 times. In the graph of FIG. 7, the square plots represent cases in which the radiation irradiation suppressing members 30 are provided, and the diamond plots represent cases in which the radiation irradiation suppressing members 30 are not provided. Note that the pixel size in the radiation image detector used in the experiment is 50 μm×50 μm.

As illustrated in FIG. 7, the sizes of the faulty pixel portions increased conspicuously in the cases that the radiation irradiation suppressing member 30 were not provided. Particularly in the case that the radiation irradiation suppressing member 30 was not provided in a radiation image detector having a small (2 to 4 pixels) initial faulty pixel portion, the diameter of the faulty pixel portion increased to approximately 10 pixels. On the other hand, in the case that the radiation irradiation suppressing member 30 was provided, the increase was suppressed to approximately 5 pixels.

The above embodiments were described as cases in which the radiation irradiation suppressing member was provided on the main body of radiation image detectors that employ the TFT readout method. Alternatively, the radiation irradiation suppressing member may be provided on the main body of a radiation image detector that employs the optical readout method. A radiation image detector that employs the optical readout method is constitute by: a first electrode layer that transmits radiation; a recording light photoconductive layer that generates charges when irradiated by radiation which is transmitted through the first electrode layer; a charge accumulating portion, for accumulating the charges generated by the recording light photoconductive layer; a readout light photoconductive layer that generates charges when irradiated by readout light; and a second electrode layer constituted by first stripe electrodes, in which a plurality of first linear electrodes that transmit the readout light are arranged parallel to each other with predetermined intervals therebetween, and second stripe electrodes, in which a plurality of second linear electrodes that do not transmit the readout light are arranged parallel to each other between the first linear electrodes with insulative films therebetween; stacked in this order, for example.

The present invention is not limited to being applied to radiation image detectors of the direct conversion type, and may also be applied to radiation image detectors of the indirect conversion type, in which light is generated by irradiation of radiation, and the generated light is detected.

Figure 8:
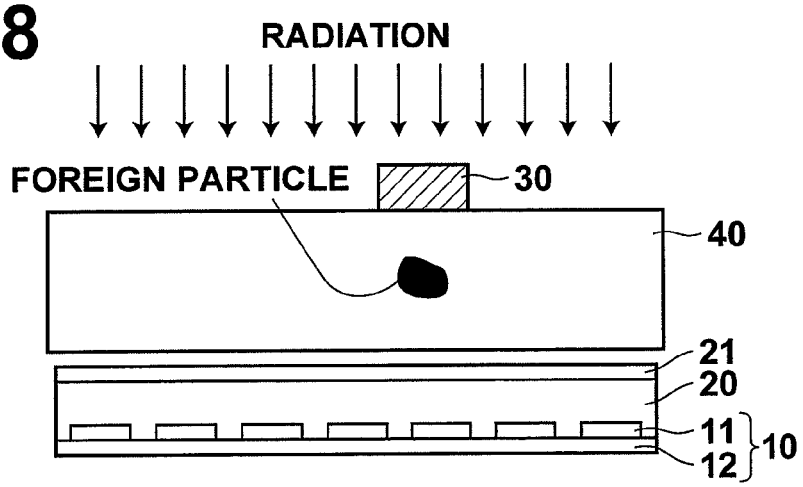
FIG. 8 is a diagram that illustrates the schematic structure of a radiation image detector according to another alternate embodiment of the present invention.

Specifically, a radiation image detector of the indirect conversion type is constituted by: a main body, in which an active matrix substrate 10, a semiconductor film 20, and an upper electrode 21 are stacked in this order; and a wavelength converter 40 that converts radiation to electromagnetic waves having longer wavelengths. Radiation is converted into visible light by the wavelength converter 40, and the light is detected by the main body of the detector, the active matrix substrate 10 of which has pixel portions 11 arranged two dimensionally thereon. Note that the upper electrode 21 is of a material and a thickness that transmits the light transmitted through the wavelength converter 40. GOS, CsI, iodized lead, and iodized mercury are examples of materials for the wavelength converter 40. In this structure, the cause of faulty pixels may be within the semiconductor film 20, or may be a foreign particle which is mixed into the wavelength converter 40 during the formation process thereof, as illustrated in FIG. 8. Repetitive irradiation by high dosage X rays may cause the faulty pixel portion to become enlarged. However, in either case, the enlargement of the faulty pixel portion can be effectively suppressed by the present invention.

In the radiation image detector of the indirect conversion type, the semiconductor film 20 may be inspected prior to the wavelength converter 40 being provided. In this case, the radiation irradiation suppressing member 30 may be provided directly above a faulty pixel portion of the semiconductor film 20, and the wavelength converter 40 maybe provided thereafter. Alternatively, the wavelength converter 40 may be provided on the main body of the detector, then the radiation image detector may be inspected to detect a faulty pixel portion. In this case, the radiation irradiation suppressing member 30 may be provided on the wavelength converter 40 at a position that corresponds to the faulty pixel portion, as illustrated in FIG. 8.

What is claimed is:

1. A radiation image detector, comprising:
a charge generating layer, for generating charges when recording electromagnetic waves bearing a radiation image is irradiated thereon; and
electromagnetic wave irradiation suppressing members, for suppressing irradiation of the recording electromagnetic waves, provided above faulty pixel portions, which are detected in advance.

2. A radiation image detector as defined in claim 1, wherein:
the charge generating layer has a-Se as its main component.

3. A radiation image detector as defined in claim 1, wherein:
the electromagnetic wave irradiation suppressing member includes a material that absorbs at least 50% of the recording electromagnetic waves irradiated thereon.

4. A radiation image detector as defined in claim 2, wherein:
the electromagnetic wave irradiation suppressing member includes a material that absorbs at least 50% of the recording electromagnetic waves irradiated thereon.

5. A radiation image detector as defined in claim 1, wherein:
the electromagnetic wave irradiation suppressing member is embedded within a material that transmits the recording electromagnetic waves.

6. A radiation image detector as defined in claim 2, wherein:
the electromagnetic wave irradiation suppressing member is embedded within a material that transmits the recording electromagnetic waves.

7. A radiation image detector as defined in claim 3, wherein:
the electromagnetic wave irradiation suppressing member is embedded within a material that transmits the recording electromagnetic waves.

8. A radiation image detector as defined in claim 4, wherein:
the electromagnetic wave irradiation suppressing member is embedded within a material that transmits the recording electromagnetic waves.

9. A radiation image detector as defined in claim 1, wherein:
the electromagnetic wave irradiation suppressing member is formed by mixing a material that absorbs the recording electromagnetic waves into one of a resin that transmits the recording electromagnetic waves and an adhesive.

10. A radiation image detector as defined in claim 2, wherein:
the electromagnetic wave irradiation suppressing member is formed by mixing a material that absorbs the recording electromagnetic waves into one of a resin that transmits the recording electromagnetic waves and an adhesive.

11. A radiation image detector as defined in claim 3, wherein:
the electromagnetic wave irradiation suppressing member is formed by mixing a material that absorbs the recording electromagnetic waves into one of a resin that transmits the recording electromagnetic waves and an adhesive.

12. A radiation image detector as defined in claim 4, wherein:
the electromagnetic wave irradiation suppressing member is formed by mixing a material that absorbs the recording electromagnetic waves into one of a resin that transmits the recording electromagnetic waves and an adhesive.

13. A radiation image detector as defined in claim 1, wherein:
the electromagnetic wave irradiation suppressing member is provided on a member that transmits the recording electromagnetic waves and which is arranged at a predetermined interval from the charge generating layer.

14. A radiation image detector as defined in claim 2, wherein:
the electromagnetic wave irradiation suppressing member is provided on a member that transmits the recording electromagnetic waves and which is arranged at a predetermined interval from the charge generating layer.

15. A radiation image detector as defined in claim 3, wherein:
the electromagnetic wave irradiation suppressing member is provided on a member that transmits the recording electromagnetic waves and which is arranged at a predetermined interval from the charge generating layer.

16. A radiation image detector as defined in claim 4, wherein:
the electromagnetic wave irradiation suppressing member is provided on a member that transmits the recording electromagnetic waves and which is arranged at a predetermined interval from the charge generating layer.

* * * * *